（12） United States Patent
Leedy (10) Patent No.: US 6,891,387 B2
(45) Date of Patent: May 10, 2005

(54) SYSTEM FOR PROBING, TESTING, BURN-IN, REPAIRING AND PROGRAMMING OF INTEGRATED CIRCUITS (75) Inventor: Glenn Leedy, Saline, MI (US)

(73) Assignee: Elm Technology Corporation, Saline, MI (US)

(*) Notice: Subject to any disclaimer, the term of this patent is extended or adjusted under 35 U.S.C. 154(b) by 0 days.

(21) Appl. No.: 10/865,579

(22) Filed: Jun. 9, 2004

(65) Prior Publication Data

US 2004/0222809 A1 Nov. 11, 2004

Related U.S. Application Data (62) Division of application No. 09/946,552, filed on Sep. 6, 2001, now Pat. No. 6,838,896, which is a division of application No. 08/474,489, filed on Jun. 7, 1995, now Pat. No. 6,288,561, which is a continuation-in-part of application No. 08/055,439, filed on Apr. 30, 1993, now Pat. No. 5,451,489, which is a division of application No. 07/775,324, filed on Oct. 11, 1991, now Pat. No. 5,225,771, which is a division of application No. 07/482,135, filed on Feb. 16, 1990, now Pat. No. 5,103,557, which is a continuation-in-part of application No. 07/194,596, filed on May 16, 1988, now Pat. No. 4,924,589, said application No. 08/474,489, is a continuation-in-part of application No. 08/315,905, filed on Sep. 30, 1994, now Pat. No. 5,869,354, which is a division of application No. 07/865,412, filed on Apr. 8, 1992, now Pat. No. 5,354,695, said application No. 08/474,489, is a continuation-in-part of application No. 08/217,410, filed on Mar. 24, 1994, now Pat. No. 5,453,404, which is a division of application No. 07/960,588, filed on Oct. 13, 1992, now Pat. No. 5,323,035.

(51) Int. Cl.[7] .......................... G01R 31/02; G01R 31/26
(52) U.S. Cl. ....................................... 324/760; 324/765
(58) Field of Search ................................ 324/754, 755, 324/757, 758, 760–762, 765, 158.1

(56) References Cited

U.S. PATENT DOCUMENTS 3,108,019 A    10/1963  Davis (Continued)

FOREIGN PATENT DOCUMENTS

EP    0 114 211    8/1984

(Continued)

OTHER PUBLICATIONS

Desai, K.S. et al. (1979). "Method for Eliminating Paste Pull–Out of Screened Green Sheet," *IBM Techn. Discl. Bull.* 21(10) :4029–4030, (no month).

(Continued)

Primary Examiner—David Zarneke
Assistant Examiner—Russell M. Kobert
(74) Attorney, Agent, or Firm—Morrison & Foerster LLP (57) ABSTRACT A system which performs multi-functions including reducing the thickness of oxides on contact pads and probing, testing, burn-in, repairing, programming and binning of integrated circuits. The system includes: at least one module having a holding fixture, a wafer, a probing device, an electronic circuit board, and a temperature control device. There are a number of integrated circuits on the wafer, and the probing device simultaneously contacts substantially all of the electrical contacts in the integrated circuits. There is a plurality of active switching circuits on the probing device. The module may also have a gas source for supplying non-oxidizing gases such as nitrogen and hydrogen into the chamber, a handler for moving the wafers and the probing devices, and a computer coupled to the chamber for controlling and communicating with the handler, the temperature control devices, the holding fixtures and the probing devices. The holding fixture holds a wafer having integrated circuits and aligns the wafer to a probing device. The temperature control device is used to heat the wafer during an oxide reduction process or during burn-in of the wafer. During an oxide reduction process, hydrogen is introduced into the chamber, and the wafer is heated so that the oxides on the contact pads can combine with hydrogen to form water vapor, thus reducing the thickness of the oxides. The computer analyzes the test and/or burn-in data and provides control signals for repairing or programming the integrated circuits. The computer system also generates a database that contains the performance data of all the integrated circuits on the wafer that are tested and allows for immediate feedback of the quality of the integrated circuits.

17 Claims, 5 Drawing Sheets

U.S. PATENT DOCUMENTS

| | | |
|---|---|---|
| 3,349,677 A | 10/1967 | Young |
| 3,405,361 A | 10/1968 | Kattner et al. |
| 3,618,201 A | 11/1971 | Makimoto et al. |
| 3,644,922 A | 2/1972 | James et al. |
| 3,702,025 A | 11/1972 | Archer |
| 3,710,251 A | 1/1973 | Hagge et al. |
| 3,744,878 A | 7/1973 | Keimle et al. |
| 3,750,136 A | 7/1973 | Roess |
| 3,786,499 A | 1/1974 | Jankowski et al. |
| 3,812,486 A | 5/1974 | Purchase |
| 3,829,857 A | 8/1974 | Allan et al. |
| 3,835,530 A | 9/1974 | Kilby |
| 3,905,818 A | 9/1975 | Margrain |
| 3,909,823 A | 9/1975 | Knowlton |
| 3,963,326 A | 6/1976 | Buchert |
| 4,038,599 A | 7/1977 | Bove et al. |
| 4,070,565 A | 1/1978 | Borrelli |
| 4,088,490 A | 5/1978 | Duke et al. |
| 4,103,297 A | 7/1978 | McGreivy et al. |
| 4,115,120 A | 9/1978 | Dyer et al. |
| 4,115,736 A | 9/1978 | Tracy |
| 4,257,041 A | 3/1981 | Masucci |
| 4,263,594 A | 4/1981 | Masucci |
| 4,409,319 A | 10/1983 | Colacino et al. |
| 4,465,972 A | 8/1984 | Sokolich |
| 4,480,288 A | 10/1984 | Gazdik et al. |
| 4,504,783 A | 3/1985 | Zasio et al. |
| 4,517,051 A | 5/1985 | Gazdik et al. |
| 4,564,584 A | 1/1986 | Fredericks et al. |
| 4,573,008 A | 2/1986 | Lischke |
| 4,585,727 A | 4/1986 | Reams |
| 4,585,991 A | 4/1986 | Reid et al. |
| 4,590,422 A | 5/1986 | Milligan |
| 4,617,730 A | 10/1986 | Geldermans et al. |
| 4,636,722 A | 1/1987 | Ardezzone |
| 4,649,339 A | 3/1987 | Grangroth et al. |
| 4,715,928 A | 12/1987 | Hamby |
| 4,719,411 A | 1/1988 | Buchler |
| 4,746,855 A | 5/1988 | Wrinn |
| 4,764,485 A | 8/1988 | Loughran et al. |
| 4,776,747 A | 10/1988 | Swapp et al. |
| 4,791,364 A | 12/1988 | Kufis et al. |
| 4,820,976 A | 4/1989 | Brown |
| 4,853,627 A | 8/1989 | Gleason et al. |
| 4,868,068 A | 9/1989 | Yamaguchi et al. |
| 4,924,589 A | 5/1990 | Leedy |
| 4,926,117 A | 5/1990 | Nevill |
| 4,926,118 A | 5/1990 | O'Connor et al. |
| 4,936,950 A | 6/1990 | Doan et al. |
| 4,951,601 A | 8/1990 | Maydan et al. |
| 4,968,931 A | 11/1990 | Littlebury et al. |
| 4,983,250 A | 1/1991 | Pan |
| 5,012,187 A | 4/1991 | Littlebury |
| 5,020,219 A | 6/1991 | Leedy |
| 5,047,711 A | 9/1991 | Smith et al. |
| 5,055,780 A | 10/1991 | Takagi et al. |
| 5,070,297 A | 12/1991 | Kwon et al. |
| 5,084,671 A | 1/1992 | Miyata et al. |
| RE33,836 E | 3/1992 | Resor, III et al. |
| 5,103,557 A | 4/1992 | Leedy |
| 5,148,100 A | 9/1992 | Sekiba |
| 5,225,771 A | 7/1993 | Leedy |
| 5,310,410 A | 5/1994 | Begin et al. |
| 5,323,035 A | 6/1994 | Leedy |
| 5,323,107 A | 6/1994 | D'Souza |
| 5,325,052 A | 6/1994 | Yamashita |
| 5,336,992 A | 8/1994 | Saito et al. |
| 5,354,695 A | 10/1994 | Leedy |
| 5,433,404 A | 7/1995 | Ashill et al. |
| 5,434,513 A | 7/1995 | Fujii et al. |
| 5,453,404 A | 9/1995 | Leedy |
| 5,457,380 A | 10/1995 | Blumenau |
| 5,495,179 A | 2/1996 | Wood et al. |
| 5,510,724 A | 4/1996 | Itoyama et al. |
| 5,512,397 A | 4/1996 | Leedy |
| 5,517,126 A | 5/1996 | Yamaguchi |
| 5,521,522 A | 5/1996 | Abe et al. |
| 5,532,610 A | 7/1996 | Tsujide et al. |
| 5,555,422 A | 9/1996 | Nakano |
| 5,592,018 A | 1/1997 | Leedy |
| 5,654,127 A | 8/1997 | Leedy |
| 5,963,027 A * | 10/1999 | Peters ..................... 324/158.1 |
| 6,288,561 B1 | 9/2001 | Leedy |

FOREIGN PATENT DOCUMENTS

| | | |
|---|---|---|
| EP | 0 203 348 | 12/1986 |
| EP | 0 259 162 | 3/1988 |
| EP | 0 259 163 | 3/1988 |
| EP | 0 508 707 | 10/1992 |
| EP | 0 557 079 | 8/1993 |
| EP | 0 699 912 | 3/1996 |
| EP | 0 864 890 | 9/1998 |
| JP | B 47-30598 | 8/1972 |
| JP | 58-157150 | 9/1983 |
| JP | 61-67936 | 4/1986 |
| JP | 61-220454 | 9/1986 |
| JP | 02-74022 | 3/1990 |
| JP | 02-224358 | 9/1990 |
| JP | 05-28697 | 2/1993 |
| JP | 6-61318 | 3/1994 |
| JP | 06-061318 | 3/1994 |
| JP | 7-115113 | 5/1995 |
| KR | 341531 | 6/1995 |
| WO | WO 80/00106 | 1/1980 |
| WO | WO 89/11659 | 11/1989 |
| WO | WO 91/12706 | 8/1991 |
| WO | WO 93/16394 | 8/1993 |
| WO | WO 93/21748 | 10/1993 |
| WO | WO 94/09513 | 4/1994 |
| WO | WO 96/41204 | 12/1996 |

OTHER PUBLICATIONS

Glanville, J. (1989). "Focused Ion Bean Technology for Integrated Circuit Modification," *Solid State Technology* 270–272, (May 1989).

Microelectronics, Millman, Jacob, and Gabriel, Arvin, Programmable ROMs (PROM), 2d pp. 301–304, McGraw Hill, New York, (no date).

Powell, D. O. and Rasile, J. (1981), "Con–formal Multi–Probe Tester Assembly," *IBM Tech Discl. Bull* 24(7A):3342–3344, (no month).

Raith, M. and Bartholomeus, M. (1991). "A New Hypergraph Based Rip–Up and Reroute Strategy" 28th ACM/IEEE Design Automation Conference, paper 4.4, pp. 54–59, (no month).

Singh, A. et al. (1985). "Technique for Lifting off Thick Film Print Fired on Alumina," *Microelectronics and Reliability* 25(4):619–620, (no month).

* cited by examiner

SYSTEM FOR PROBING, TESTING, BURN-IN, REPAIRING AND PROGRAMMING OF INTEGRATED CIRCUITS

CROSS-REFERENCE TO RELATED APPLICATIONS

This application is a divisional of U.S. patent application Ser. No. 09/946,552 filed Sep. 6, 2001, now U.S. Pat. No. 6,838,896, incorporated herein by reference in its entirety, which is a divisional of Ser. No. 08/474,489 filed Jun. 7, 1995, U.S. Pat. No. 6,288,561; which is a CIP of Ser. No. 08/055,439 filed Apr. 30, 1993, U.S. Pat. No. 5,451,489; which is a divisional of Ser. No. 07/775,324 filed Oct. 11, 1991, U.S. Pat. No. 5,225,771; which is a divisional of Ser. No. 07/482,135 filed Feb. 16, 1990, U.S. Pat. No. 5,103,557; which is a CIP of Ser. No. 07/194,596 filed May 16, 1998, U.S. Pat. No. 4,924,589 and said Ser. No. 08/474,489 filed Jun. 7, 1995 is a CIP of Ser. No. 08/315,905 filed Sep. 30, 1994, U.S. Pat. No. 5,869,354; which is a divisional of Ser. No. 07/865,412 filed Apr. 8, 1992, U.S. Pat. No. 5,354,695 and said Ser. No. 08/474,489 filed Jun. 7, 1995 is a CIP of Ser. No. 08/217,410 filed Mar. 24, 1994, U.S. Pat. No. 5,453,404; which is a divisional of Ser. No. 07/960,588 filed Oct. 13, 1992, U.S. Pat. No. 5,323,035.

BACKGROUND OF THE INVENTION

1. Field of the Invention

The present invention relates to test equipment and more particularly to equipment for probing, testing, burn-in, repairing, programming and binning of integrated circuits.

2. Description of the Related Art

In conventional semiconductor equipment technologies, separate pieces of equipment are required to test, burn-in, repair, program and bin integrated circuits (ICs). Integrated circuits that are in wafer form are tested or screened for packaging using a tungsten needle probe card, wafer positioning equipment called a prober and automatic test equipment (ATE) which supplies test signals to the probe card and determines the validity of any output signals. A probe card is a connector that provides a mechanical means for making a temporary contact to the contact pads on an IC for the purpose of testing the IC. The probe card may contact only a single die, but it may typically contact as many as eight or more dice if the dice consist of memory ICs. A die typically consists of one IC; however, it may include a plurality of ICs. Conventional probe cards do not provide the capability of contacting all the dice on a wafer at once.

An IC is typically burned-in and speed-graded prior to its use or sale. Burn-in of circuit devices requires many hours of testing the devices under stressing temperature and electrical conditions. An IC is burned-in to lower the possibility that it will fail after it is inserted into an electronic assembly such as a Multi-Chip Module (MCM) or printed circuit board (PCB) of other ICs. Burn-in of an IC is performed typically after the IC is in packaged form. Burn-in fixtures for processing a die before packaging, so called bare die burn-in, are beginning to become available. Whether an IC is in packaged form or in die form, a separate piece of equipment is used to burn-in an IC. After an IC has been burned-in, it is speed-graded or binned using automatic test equipment. Binning is a process that sorts ICs according to their performance characteristics.

When an IC is in wafer form, and it contains shorts that disrupt the functionality of the IC, it may be repaired by removing portions of a deposited layer (e.g., a polysilicon layer or an aluminum metal layer). A laser cutting machine is typically used to perform the circuit repair. If an IC is a memory circuit array, yet another machine is required to program the memory circuit array by fusing or anti-fusing circuits within the memory circuit array. Subsequent to repair of an IC, the IC must be tested again.

It would be advantageous, and is therefore an object of the present invention to provide a single piece of equipment that can perform all of the functions mentioned above that are previously done by separate pieces of equipment to reduce capital equipment expense and the number of steps required for IC burn-in, testing, repairing and/or programming.

SUMMARY OF THE INVENTION

The present invention provides a system that can perform multi-functions including reducing the thickness of oxides on contact pads and probing, testing, burn-in, repairing, programming, marking and binning of integrated circuits. A system according to one embodiment of the present invention includes: one or a plurality of modules each having a holding fixture, a wafer, a probing device, other processing device such as a die inking or repairing device, an electronic circuit board, and a thermal control device. There are a number of integrated circuits on the wafer, and the probing device simultaneously contacts substantially all of the electrical contacts on the integrated circuits. There is a plurality of active switching circuits on the probing device. The module may also have a gas source for supplying non-oxidizing gases such as nitrogen and hydrogen into the chamber, a handler for moving the wafers and the probing or other processing devices, and a computer coupled to the chamber for controlling and communicating with the handler, the temperature control devices, the holding fixtures, the probing and other processing devices.

The holding fixture holds a wafer having integrated circuits and aligns the wafer to a probing device or other processing device. An integrated circuit has a plurality of conductive contact portions, typically referred to as contact, I/O or bond pads, that are couplable to probe points of the probing device. The temperature control device is used to heat the wafer during an oxide reduction process. When hydrogen is present in the chamber and the wafer is heated, the oxides on the wafer combine with hydrogen to form water vapor, thus reducing the thickness of the oxides. The temperature control device may also be used to heat or cool the wafer during burn-in of the wafer.

The probing device can have multiple probe points or a single probe point. The probing device can be a full-wafer probing device having active switching logic circuits to allow controlled access to each of the integrated circuits on a wafer, and optionally, generate some or all of the test signals required for testing the die.

The computer can generate a computer database with the various status information for every circuit processed by wafer and on-wafer site location. The database can provide timely performance distribution statistics and physical distribution statistics to the circuit manufacturing engineers or process engineers to allow adjustments to be made to the manufacturing process. By using the—database, processing steps that are slowly going out of specification and affecting product quality can be corrected. Thus, the capability of near-real time adjustments to the manufacturing process will allow savings by reducing the number of products that do not satisfy specifications.

The present invention allows a single semiconductor test and circuit configuration machine to perform any or all of the following: (a) reducing the thickness of oxides on contact pads of integrated circuits on a wafer by supplying a first non-oxidizing gas such as nitrogen into the chamber, heating the contact pads, and supplying a second non-oxidizing gas such as hydrogen into the chamber so that the oxides can combine with hydrogen to form water vapor, (b) probing the contact pads using a probing device, (c) testing the functionality of the integrated circuits, (d) burning-in the integrated circuits for a predetermined period of time over a predetermined range of temperature with predetermined temperature rate of change and electrical conditions, (e) generating test vector data and analyzing data collected from the integrated circuits, (f) repairing the integrated circuits, (g) programming the integrated circuits by fusing or anti-fusing specific circuits within the integrated circuits, (h) marking or printing on the wafer, (i) binning the integrated circuits according to their performance characteristics, and (j) collection of a database for immediate feedback to the manufacturing process.

BRIEF DESCRIPTION OF THE DRAWINGS

The objects, features and advantage of the present invention will be apparent from the following detailed description in which.

DETAILED DESCRIPTION OF THE INVENTION

The present invention provides methods and apparatus for performing testing, burn-in, repairing, programming, and binning of integrated circuits in a closed environment using a single piece of equipment. In the following detailed description, numerous specific details are set forth such as particular hardware configurations and a flow chart to provide a thorough understanding of the present invention. It will be appreciated, however, by one having ordinary skill in the art that the present invention may be practiced without such specific details. In other instances, well-known structures and methods are not described to avoid obscuring the present invention unnecessarily.

Figure 1:
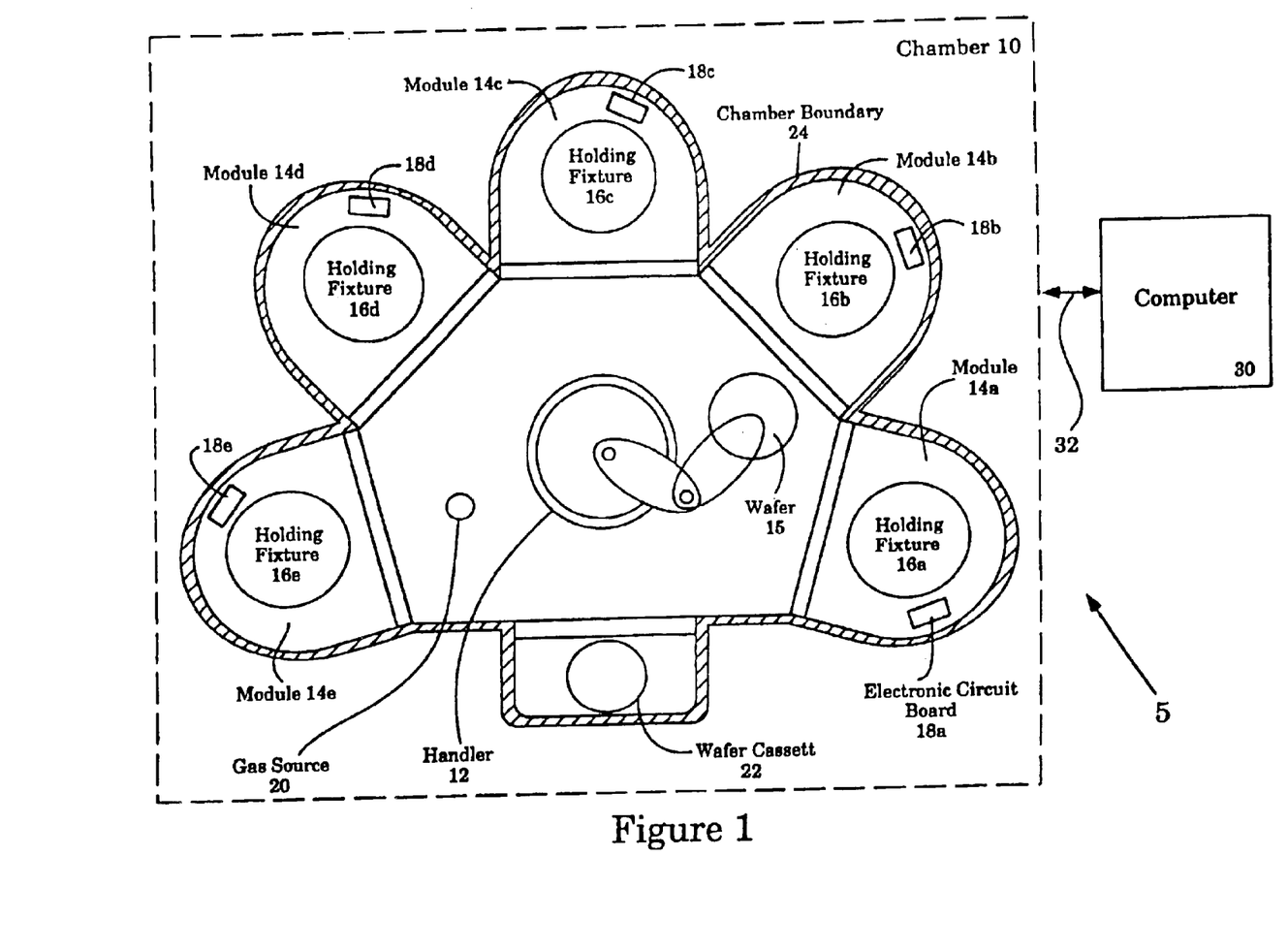
FIG. 1 is a multi-functional semiconductor test and circuit configuration system according to the present invention.

Now referring to FIG. 1, a semiconductor test and circuit configuration system 5, which is a cluster tool, is presented according to one embodiment of the present invention. System 5 includes a chamber 10 and a computer 30. Chamber 10 includes a plurality of modules 14a–14e for processing wafers, a handler 12 for moving wafers and probing devices, and a wafer cassette 22 for holding a plurality of wafers.

It will be appreciated that the present invention may be used to process other substrates even though the specific details set forth the processing of a semiconductor wafer. Other substrates, circuit substrate types, or substrate assemblies that the present invention can process are Multi-Chip Module and flat panel display substrates which may be made from various materials such as AlN, SiC, quartz, glass or diamond.

Chamber 10 shown in FIG. 1 includes a plurality of modules. Although five modules are shown in FIG. 1, chamber 10 may include more modules or fewer modules. Since a wafer cassette usually holds twenty-five wafers, a chamber can be made to include twenty-five modules for processing twenty-five wafers simultaneously. It should be noted that each of the modules may perform the same function (or functions). For instance, all of the modules may perform functional testing, burn-in and repairing of ICs in the same sequence and at the same time. On the other hand, the modules may perform different functions. For example, while module 14a performs a functional test, module 14b may perform programming of ICs. Moreover, the modules can also perform each function independently and in any order, such as performing a test function without burn-in processing or performing a test function both before and after other processing steps.

Chamber 10 may be a closed system or an open system. When chamber 10 is a closed system, chamber 10 is a gas tight system, not allowing gas molecules to move across the chamber boundary 24. The pressure inside chamber 10 may be more than, at, or less than atmospheric pressure. In one embodiment, chamber 10 includes a gas source 20 wherein gas source 20 can introduce non-oxidizing gases such as nitrogen and hydrogen into chamber 10. As will be described later, having a non-oxidizing environment is beneficial in forming good contacts between probing devices and the contact pads of integrated circuits.

It will be appreciated that in another embodiment, each module in chamber 10 can be in a separate gas-tight closed environment. In such a case, each module would have doors to close off and isolate the atmosphere and temperature of the module and each module could contain a separate gas source. For example, one module can contain nitrogen and hydrogen to reduce the thickness of metal oxide films, while another module may contain only nitrogen to perform another function such as a functionality test on an IC.

Handler 12 in FIG. 1 can be a robotic system that moves wafers between wafer cassette 22 and the holding fixtures or between the holding fixtures and changes the probing devices when the type of wafer is changed. Handler 12 has the capability to move multiple wafers simultaneously. It should be noted that a module can be manually loaded with a wafer instead of using the handler 12.

Figure 2:
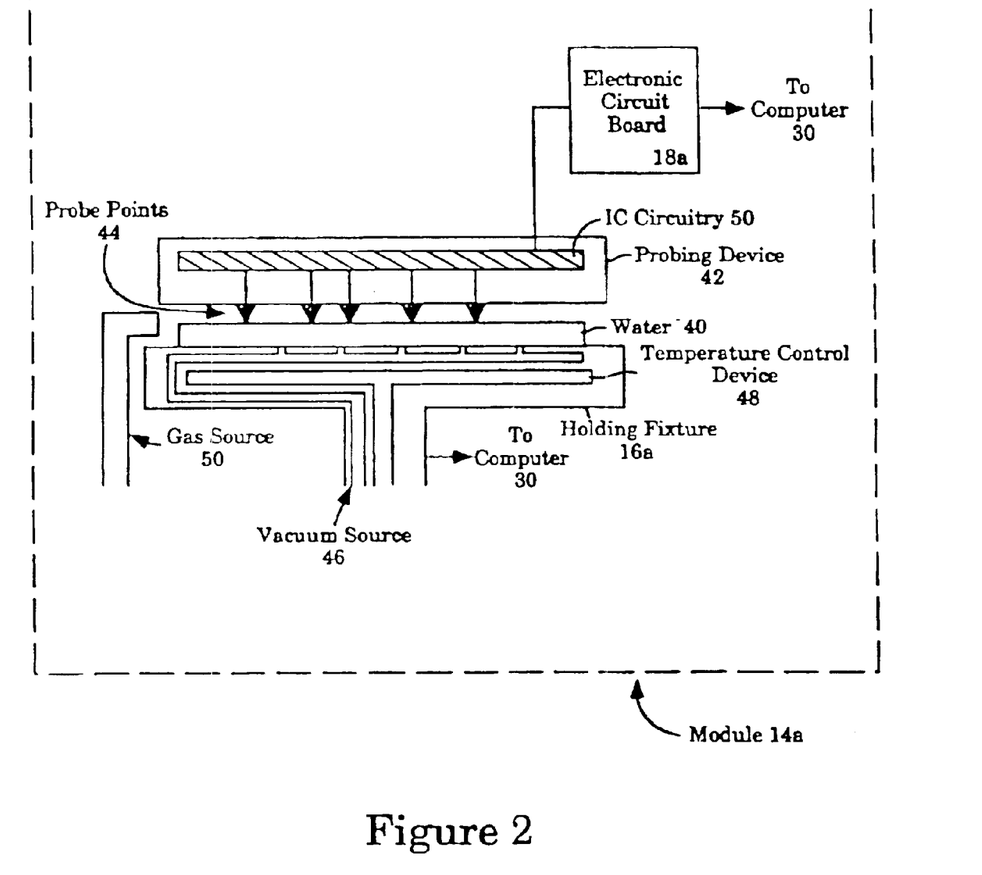
FIG. 2 is one of the modules shown in FIG. 1.

FIG. 2 presents a module $14a^1$. Module $14a^1$ is identical to module 14a of FIG. 1 except that module $14a^1$ contains a gas source 50. Since modules 14a–14e are identical, no separate description is provided for modules 14a–14e. Module $14a^1$ in FIG. 2 includes a probing device 42 having probe points 44 for probing contact pads on wafer 40 and circuitry 50 which is coupled to an electronic circuit board 18a. A holding fixture 16a has a plurality of vacuum holes for pulling down wafer 40 onto holding fixture 16a and a thermal control device 48 for controlling the temperature of the substrate 40. Module $14a^1$ also includes a gas source 50 for introducing non-oxidizing gases into module $14a^1$.

Figure 3:
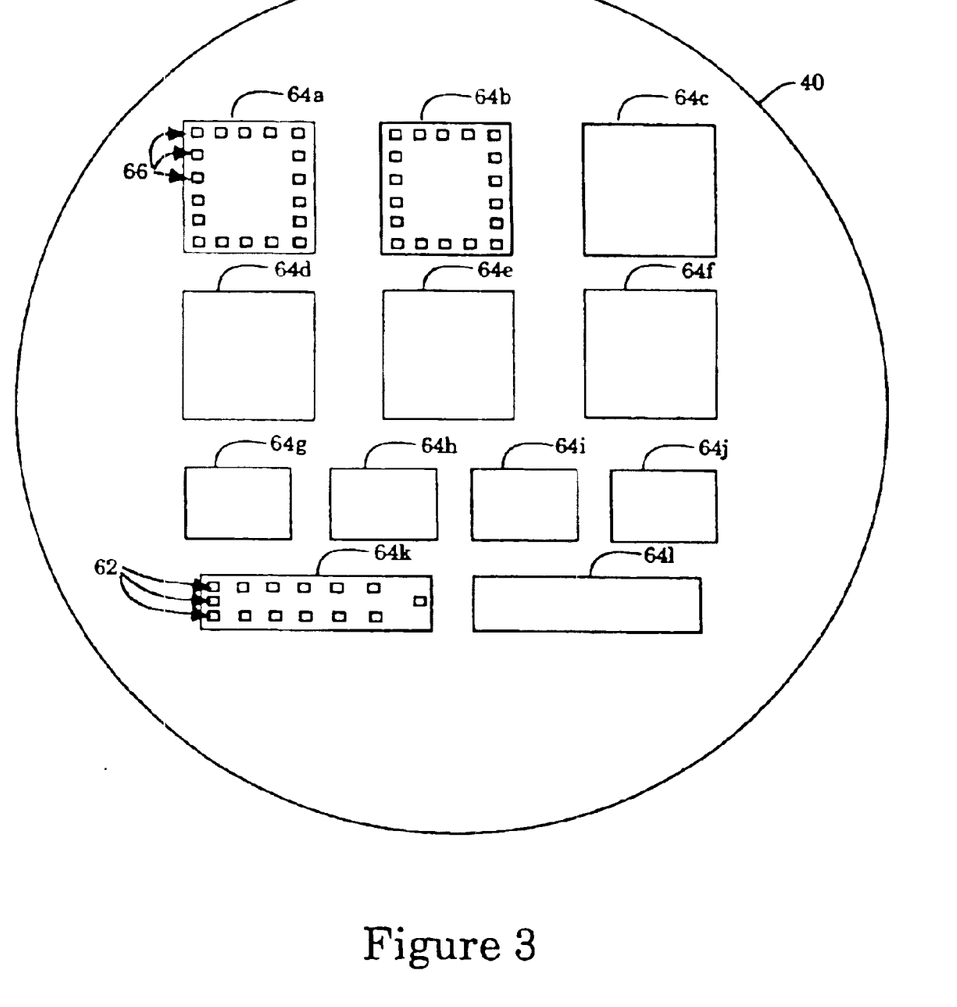
FIG. 3 is a wafer having a plurality of integrated circuits.

Wafer 40 includes a plurality of integrated circuits (ICs) 64a–64l as shown in FIG. 3. Each IC includes a plurality of conductive contact portions such as contact pads 66 (not all are shown in FIG. 3). Conductive contact portions arc not limited to contact pads, and they may include various types of metal portions that are exposed on a wafer. Conductive contact portions are usually made of aluminum. However, they may be made from various other types of metal. ICs on wafer 40 may be of different sizes, and the contact pads may be also of different sizes. Wafer 40 in FIG. 2 may represent a full wafer as shown in FIG. 3 or a partial wafer. In the preferred embodiment, wafer 40 is a whole wafer. Wafer 40 may be a silicon wafer, GaAs wafer, or any other semiconductor wafer. It should be noted that wafer 40 may include only simple circuits wherein the circuits may be passive circuits, active circuits or metal lines.

Continuing to refer to FIG. 2, probing device 42 may contain a single probe point, a small number of probe points (5–40) or a large number of probe points (approximately 100,000 to 500,000 or more). In the preferred embodiment, probing device 42 is a full-wafer probing device. U.S. Pat. Nos. 5,103,557 and 5,323,035 issued to this inventor disclose how a full-wafer probing device can be fabricated. A full-wafer probing device has the capability to contact all of the contact pads on a wafer at once. The number of probe contact points that may be required in such wafer probing device can exceed 100,000 points. As shown in U.S. Pat. No. 5,103,557, a full-wafer probing device can also include a circuitry that allows each die of a wafer to be individually tested and/or isolated if it is faulty. This is shown as circuitry 50 in FIG. 2. Also, U.S. Pat. No. 5,354,695 discloses a fabrication process for making an intelligent probing device through the use of membrane circuits. IC circuitry 50 also provides the means to reduce the number of electronic signal connections to and from the probing device to a number that is approximately the same as the number of signals associated with each die and not the number of connections equal the number of dice on a wafer times the signals per die. When IC circuitry 50 incorporates active circuit switching logic, it provides a controlled access to each die on a wafer.

IC circuitry 50 of probing device 42 is connected to electronic circuit board 18a which is coupled to computer 30 in FIG. 1. Electronic circuit board 18a is used as a common mechanical and an electrical interface between probing device 42 and computer 30 so that probing device 42 can receive control signals from computer 30 and send data signals to computer 30. In another embodiment, chamber 10 of FIG. 1 can contain one electronic circuit board for all the probing devices instead of having one electronic circuit board for each probing device as shown in FIG. 2.

Probing device 42 has probe points 44 and IC circuitry 50 that are specific for a wafer being tested. A probing device can be changed with another by handler 12 in FIG. 1 when the type of wafer is changed. Although probing device 42 can incorporate active device switching circuitry such as transistors on the electronic circuit boards, probing device 42 could also only incorporate passive circuit elements such as resistors, inductors, and capacitors. In the latter embodiment, there would be a reduction in the complexity of fabrication of probing devices but an increase in the number of I/O interconnections from probing devices to the supporting control circuitry. With the former embodiment of the probing devices, higher at-speed tests can be performed as there is no concern for degradation of signal integrity due to the constraints of path propagation and signal bandwidth. The incorporation of active device switching circuitry into probing devices would create intelligent and programmable probing devices.

Still continuing to refer to FIG. 2, holding fixture 16a is used to hold wafer 40 and align wafer 40 to probing device 42. Holding fixture 16a includes a vacuum source 46 having a plurality of vacuum holes to hold wafer 40 firmly against holding fixture 16a and temperature control device 48 for heating or cooling wafer 40. Holding fixture 16a is controlled by computer 30 in FIG. 1. When wafer 40 is placed on holding fixture 16a, computer 30 sends control signals to vacuum source 46 to apply vacuum to pull down wafer 40 against holding fixture 16a, and at the completion of testing, repairing or programming of the ICs on wafer 40, vacuum source 46 may be turned off so that wafer 40 can be released from holding fixture 16a.

Temperature control device 48 is also controlled by computer 30. To burn-in wafer 40 or to remove oxide from the contact pads of wafer 40, computer 30 sends control signals to temperature control device 48 to control the temperature of the wafer 40. Computer 30 controls and monitors the temperature of wafer 40 so that it is changed to predetermined temperatures for a predetermined period of time. The rate at which the temperature of wafer 40 is changed can also be controlled by computer 30 through the use of temperature control device 48. In FIG. 2, temperature control device 48 is embedded in holding fixture 16a to control the temperature of wafer 40. However, wafer 40 can be heated by radiation or by some type of ion beams. Focused ion beams can be used to heat only a portion of wafer 40 or only a specific contact pad on wafer 40. Temperature control device 48 can also be used to reduce the temperature of wafer 40 for cases where the operation of all the circuits on a substrate may have a combined thermal energy generation exceeding the desired burn-in temperature or for situations where simulation of a low temperature environment is desired. For temperatures lower than 25° C., where moisture condensation can result on substrates, the use of a gas tight system as described above would be preferred such that most of the water content is removed. The common methods and apparatus used to control the temperature of a substrate is well-known in the art and thus is not discussed further.

Computer 30 also controls the movement of holding fixture 16a so that it can be aligned to probing device 42. The detailed description of alignment of wafer 40 to probing device 42 is disclosed in U.S. Pat. Nos. 5,103,1557 and 5,354,695, describing optical and electronic sensors, respectively. It should be noted that instead of moving holding fixture 16a, probing device 42 can be moved to align probing device 42 to wafer 40. Although, in the preferred embodiment, computer 30 controls turning on and off vacuum source 46, the movement of holding fixture 16a and the temperature of temperature control device 48, such functions can be performed manually.

During functional circuit testing, computer 30 sends control signals to probe points 44 of probing device 42 through electronic circuit board 18a and IC circuitry 50. ICs on wafer 40 generate data signals in response to the control signals, and the data signals are sent back to computer 30 so that computer 30 can analyze the data signals and determine the functionality of each IC on wafer 40. During burn-in, computer 30 sends control signals to heat or cool wafer 40 to specific temperatures for a predetermined period of time and electrical signals to probe points 44 of probing device 42 so that the ICs on wafer 40 can be tested while they are stressed under certain temperature and electrical conditions. The ICs on wafer 40 generate data signals which are sent to computer 30 to analyze and determine which ICs pass the burn-in test.

After a functional test or a burn-in test, computer 30 analyzes the data obtained from the ICs on wafer 40 and provides new control signals to probe points 44 either to repair the ICs on wafer 40 and/or to program the ICs by fusing or anti-fusing circuits within the ICs as is done with memory circuits. For example, to repair a circuit, computer 30 can provide control signals to probing device 42 so that high voltage or current can be provided between the appropriate probe points to open up a conducting path or conducting paths. This repairing scheme is used in many areas including, but not limited to, removing shorts created by manufacturing defects, disabling or enabling a portion of a circuit, isolating a portion of a circuit, and attaching a spare or redundant subcircuit replacing a sub-circuit that has been detached from a main circuit. To program a memory circuit array, computer 30 sends control signals based on the data collected from each IC on wafer 40. IC circuitry 50 of probing device 42 configures the probe points to enable direct programming of fuses or anti-fuses through the probe points. A Read Only memory circuit array is typically a programmable read only memory (PROM) or a programmable logic array (PLA).

The present invention allows a single semiconductor test and circuit configuration system to perform any or all of the following functions: (a) reducing the thickness of oxide films, (b) performing functionality tests on integrated circuits, (c) performing burn-in tests on ICs, (d) repairing the circuits, (e) programming fuses or anti-fuses, (f) binning the ICs that have, been tested, and (g) collection of a database for immediate feedback to the manufacturing process.

First, the present invention can be used to reduce the thickness of oxide films on contact pads of ICs. A typical IC contact pad is made of aluminum, and it naturally forms a 25° A to 40° A oxide film on the surface of the contact pad soon after the contact pad is exposed to oxygen. This oxide film optionally can be penetrated by a piercing probe point as described in patent U.S. Pat. No. 5,323,035 in order to achieve a low resistance contact between a probing point and the contact pad. In operation, when a wafer is moved from wafer cassette 22 onto a holding fixture 16a in module 14a, a non-oxidizing gas such as nitrogen is introduced to flood chamber 10 and to purge the chamber of oxygen. Then the temperature of the wafer is changed to a specific temperature appropriate for the metal of the contact pads, and a few percent by volume of hydrogen is introduced over the surface of the wafer so that the oxide films can be converted into water vapor when they are combined with hydrogen. The oxide films may be completely removed from the contact pads, or at least the thickness of the oxide films will be reduced by this process. By maintaining a nitrogen environment in chamber 10, no further oxide is formed on the surface of the metal contact pads, thus providing better contacts between the contact pads and the probing points. Nitrogen is a preferred non-oxidizing gas, and there may be other gases such as argon that may be used in chamber 10.

Second, the present invention can be used for functional testing of integrated circuits. After the oxide films on the contact pads have been removed or reduced in thickness, or subsequently are to be pierced, the probing points of the probing device come into contact with the contact pads on the wafer. Computer 30 controls the functional testing of the ICs' on the wafer. Computer 30 supplies the control signals, receives data signals back from the probing points, and analyzes the data to determine which ICs are functional on the wafer.

Third, the present invention can also perform burn-in of integrated circuits. During burn-in, the integrated circuits on the wafers are tested for a predetermined period of time over a range of predetermined temperature and electrical conditions to produce burn-in data which is transmitted to computer 30 for analysis.

Fourth, after obtaining data from the ICs, computer 30 can analyze the data and bin or speed-grade the integrated circuits according to their individually determined maximum performance.

Fifth, the present invention can also be used to repair the circuits. Computer 30 can supply appropriate control signals to the probe points of the probing device so that appropriate voltage or current can be applied between the probe points to electrically isolate defective portion of an IC or electrically connect spare circuit portions of an IC with the use of fuse and anti-fuse circuit devices. Under appropriate circumstance, arbitrary shorts in a circuit may be opened if probe points are positioned anticipating such short failure condition.

Sixth, the present invention provides a means for programming PROM, EEPROM or PLA circuits. The programming done is typically to pre-set or store binary values in non-volatile memories such as PROM or EEPROM. Small nonvolatile memories in microprocessor circuits may also be programmed with serial numbers or version numbers, and configuration or operational parameters that have been generated by test/burn-in processing. Logic products with non-volatile memory may also be programmed such as PLA's or FPLA's. The present invention can also verify and test the capabilities of the circuits after it has been programmed. Thus, if the wafers in chamber 10 contain memory circuits, computer 30 can supply control signals to the probe points so that the probe points can apply appropriate charges to the circuits within the memory circuits. The ICs can be re-tested for their functionality or burned-in after the circuits are repaired and/or programmed. Also, the binning process can be performed after a functionality test, burn-in or circuit configuration.

Seventh, the present invention provides a means for generating a computer database with the various status information for every circuit processed. This database can be used in subsequent processing steps by the present invention, such as in the repairing or programming steps. One important aspect of the database is that it can provide timely performance distribution statistics and physical distribution statistics to the circuit manufacturing engineers or process engineers. Presently, such information is only partially available after packaging is completed, typically several weeks later. The present invention would make the availability of this information timely enough to allow adjustments to be made to the manufacturing process so that processing steps that are slowly going out of specification and affecting product quality can be corrected. The capability of near-real time adjustments to the manufacturing process will allow savings by reducing the number of products that do not satisfy specifications.

Figure 4:
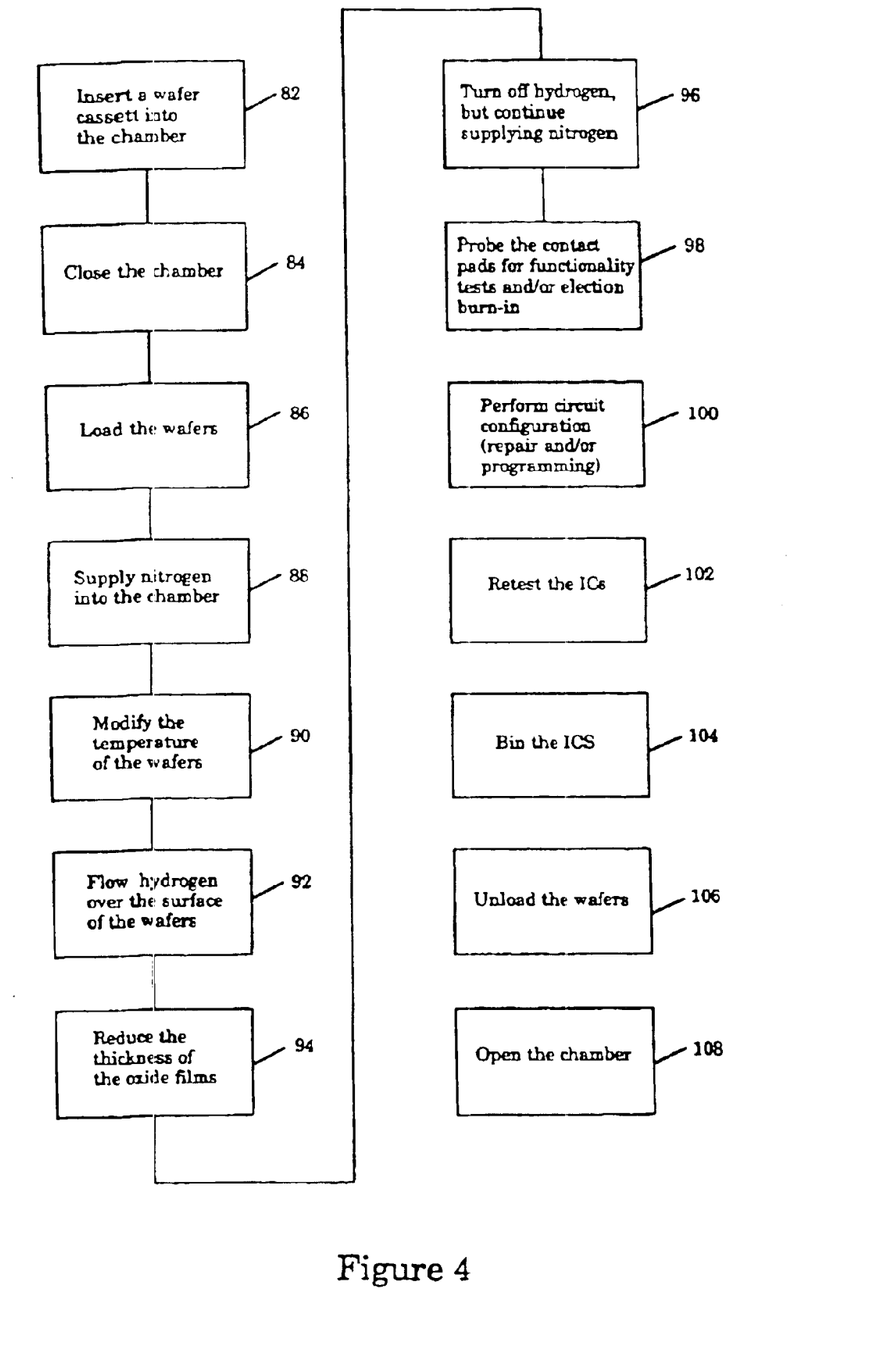
FIG. 4 is a flow chart illustrating the steps of reducing the thickness of oxide films on the contact pads of the integrated circuits and the steps of testing, burning-in, configuring and binning the integrated circuits according to the present invention.

FIG. 4 presents a flow chart illustrating a typical process flow of the present invention. At step 82, a wafer cassette having a plurality of wafers is inserted into the chamber. At step 84, the chamber is closed. At step 86, the wafers are loaded into the individual modules using handler 12 in FIG. 1. At step 88, a non-oxidizing gas such as nitrogen is introduced into chamber 10 to flood the chamber and purge the chamber of oxygen and moisture. At step 90, the wafers are heated. At step 92, a few percent by volume of hydrogen is introduced over the surfaces of the wafers. At step 94, the oxide films on the contact pads of the wafers are removed or reduced in thickness when the oxides combine with hydrogen. At step 96, hydrogen is stopped from flowing into chamber 10, but nitrogen continues to be supplied to chamber 10 to maintain a nitrogen environment in chamber 10. At step 98, the ICs are probed for a functionality test and/or electrical burn-in. At step 100, circuit configuration can be performed to either repair the circuits and/or to program the circuits if the circuits are non-volatile memory circuits. At step 102, the ICs on the wafers can be re-tested for their functionality. At step 104, computer 30 in FIG. 1 can analyze the data obtained from the ICs and bin the ICs according to their performance characteristics. At step 106, the wafers are unloaded from the holding fixtures and placed into the wafer cassette. At step 108, the chamber is opened to take the wafer cassette out from the chamber.

Figure 5:
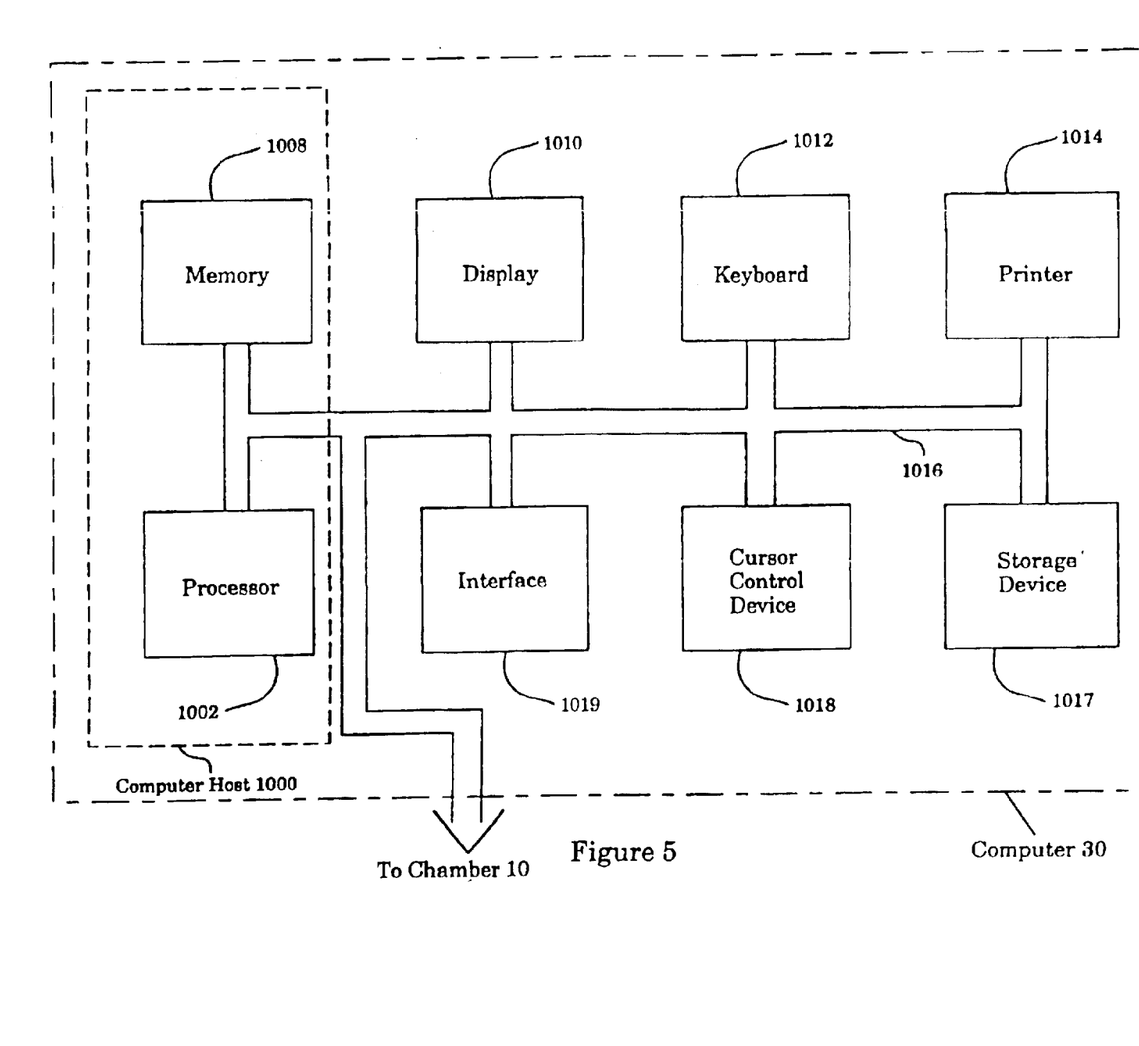
FIG. 5 is a detailed block diagram of the computer shown in FIG. 1 according to one embodiment of the present invention.

FIG. 5 shows a computer system that may be utilized as computer 30 in FIG. 1 in accordance with the present invention. A computer host 1000 includes a memory 1008 and a central processor 1002. Memory 1008 and central processor 1002 are those typically found in most general purpose computers and almost all special purpose computers. In fact, these devices contained within computer host 1000 are intended to be representative of the broad category of data processors and memory. Many commercially available computers having different capabilities may be utilized in the present invention. It will be appreciated that although computer 30 may include various other components described below, it may only need computer host 1000 to control the elements in chamber 10.

A system bus 1016 is provided for communicating information to and from computer host 1000 and the electronics in chamber 10 to allow control and the transfer of data. System bus 1016 can also be used to connect computer host 1000 to other components. For example, a display device 1010 utilized with the computer system of the present invention may be a liquid crystal device, cathode ray tube or other display device suitable for creating graphic images and/or alphanumeric characters recognizable to a user. The computer system may also include an alphanumeric input device 1012 including alphanumeric and function keys coupled to bus 1016 for communicating information and command selections to central processor 1002, and a cursor control device 1018 coupled to bus 1016 for communicating user input information and command selections to central processor 1002 based on a user's hand movement. Cursor control device 1018 allows the user to dynamically signal the two-dimensional movement of the visual symbol (or cursor) on a display screen of display device 1010. Many implementations of cursor control device 1018 are known in the art, including a track ball, mouse, pen, joystick or special keys on the alphanumeric input device 1012, all capable of signaling movement in a given direction or manner of displacement.

The computer system of FIG. 5 also includes an interface device 1019 coupled to bus 1016 for communicating information to and from the computer system. Interface device 1019 may be coupled to a microphone, a speaker, a network system, other memory devices, other computers, etc. Also available for interface with the computer system of the present invention is a data storage device 1017 such as a magnetic disk or optical disk drive, which may be communicatively coupled with bus 1016, for storing data and instructions. The computer system of FIG. 5 may also include a printer for outputting data.

Although functional testing is the typical testing capability of the preferred environment, parametric testing can also be done for circuit characterization. The software that controls the mechanics of the present invention, the data preparation for testing, test processing, and test result analyzing complements the circuitry contained in the probing devices contained in the modules. While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. A system for probing integrated circuits comprising:
    a chamber including:
    at least one module having a holding fixture, a temperature control device and a probing device, said holding fixture adapted to hold a substrate having a plurality of integrated circuits, each of said integrated circuits having a plurality of conductive contact portions, said temperature control device for modifying the temperature of said substrate, said probing device having a plurality of probe points for simultaneously contacting substantially all of said plurality of conductive contact portions of substantially all of said integrated circuits of said substrate and having a plurality of active switching circuits incorporated on said probing device for controlling access to a majority of said conductive contact portions.

2. The system according to claim 1 wherein said module further includes:
    a gas source adapted to supply at least a non-oxidizing gas into said module; and
    a handler adapted to move said substrate.

3. The system according to claim 2 wherein said temperature control device controls the temperature of said substrate, and said gas source provides hydrogen thereby to reduce the thickness of oxides on said plurality of conductive contact portions.

4. The system according to claim 1 wherein said module includes an electronic circuit board adapted to be coupled to a computer, said active switching circuits being coupled to said electronic circuit board, and said active switching circuits allow a controlled access to each of said integrated circuits on said substrate.

5. The system according to claim 1 further including a computer coupled to said chamber for controlling and communicating with said temperature control device, said holding fixture, said probing device, and with a handler adapted to move said substrate, said computer including a processor and a data storage device
    wherein at least one of the functions listed below is performed while said substrate is in said chamber:
    reducing the thickness of oxides on said plurality of conductive contact portions of said substrate;
    concurrently testing functionality of substantially all of said integrated circuits of said substrate;
    concurrently burning-in substantially all of said integrated circuits of said substrate;
    concurrently repairing substantially all of said integrated circuits of said substrate;
    concurrently programming substantially all of said integrated circuits of said substrate;
    marking a symbol on said substrate; and,
    collecting data corresponding to performance data of said integrated circuits thereby to provide information for manufacturing process control.

6. The system according to claim 1 further including a second module having a second holding fixture, a second temperature control device and a second probing device, said second holding fixture adapted to hold a second substrate having a plurality of integrated circuits, each of said integrated circuits of said second substrate having a second plurality of conductive contact portions, said second temperature control device adapted to control the temperature of said second substrate, said second probing device having a second plurality of probe points for simultaneously contacting substantially all of said second plurality of conductive contact portions of substantially all of said integrated circuits of said second substrate.

7. The system according to claim 6 wherein said first and second modules are adapted to perform identical functions simultaneously.

8. The system according to claim 1 wherein said integrated circuits of said substrate are functionally tested, burned-in and configured in said chamber.

9. The system according to claim 1 wherein said module is gas tight.

10. The system according to claim 1 further including a computer coupled to said chamber for controlling and communicating with said temperature control device, said holding fixture, said probing device, and with a handler adapted to move said substrate, said computer including a processor and a data storage device wherein at least one of the functions listed below is performed while said substrate is in said chamber:

reducing the thickness of oxides on said plurality of conductive contact portions of said substrate;

(b) testing functionality of said integrated circuits of said substrate;

(c) burning-in said substrate;

(d) repairing said integrated circuits of said substrate;

(e) programming said integrated circuits of said substrate;

(f) marking a symbol on said substrate; and, collecting data corresponding to performance of said integrated circuits thereby to provide information for manufacturing process control.

11. The system according to claim 1, wherein said probe points extend from a first surface of said probing device and said active switching circuits are adjacent an obverse surface of said probing device.

12. The system according to claim 1, wherein a number of connections of said active switching circuits external to said probing device is less than a number of said plurality of probe points.

13. A system for probing integrated circuits, comprising:

a holding fixture, a temperature control device, and a probing device, wherein said holding fixture is adapted to hold a substrate having a plurality of integrated circuits, each of said integrated circuits having a plurality of contact points, said probing device having a plurality of probe points adapted to contact simultaneously substantially all of said plurality of conductive contact portions of substantially all of said integrated circuits and having a plurality of active switching circuits incorporated on said probing device for controlling access to a majority of said contact points, and wherein said temperature control device is adapted to control the temperature of said substrate.

14. The system according to claim 13, further comprising a gas source adapted to supply at least an oxide-reducing gas into said system thereby to reduce the thickness of oxides on said plurality of contact portions.

15. The system according to claim 14, wherein said oxide-reducing gas is hydrogen.

16. The system according to claim 13, wherein said probe points extend from a first surface of said probing device and said active switching circuits are adjacent an obverse surface of said probing device.

17. The system according to claim 13, wherein a number of connections of said active switching circuits external to said probing device is less than a number of said plurality of probe points.

* * * * *